United States Patent [19]
Han

[11] Patent Number: 4,638,506
[45] Date of Patent: Jan. 20, 1987

[54] SOUND FIELD SIMULATION SYSTEM AND METHOD FOR CALIBRATING SAME

[76] Inventor: Hok L. Han, No. 67 Thorbeckestraat, 2613 BV Delft, Netherlands

[21] Appl. No.: 707,527

[22] Filed: Mar. 4, 1985

Related U.S. Application Data

[63] Continuation of Ser. No. 574,639, Jan. 30, 1984, abandoned, which is a continuation of Ser. No. 305,198, Sep. 24, 1981, abandoned.

[51] Int. Cl.$^4$ .............................................. H03G 3/00
[52] U.S. Cl. ........................................ 381/34; 381/63
[58] Field of Search .................................. 381/61–63; 364/107

[56] References Cited

U.S. PATENT DOCUMENTS

| | | | |
|---|---|---|---|
| 3,159,829 | 12/1964 | Straehl . | |
| 4,039,755 | 8/1977 | Berkovitz | 179/1 J |
| 4,105,864 | 8/1978 | Berkovitz | 179/1 J |
| 4,181,820 | 1/1980 | Blesser et al. | 179/1 J |
| 4,275,267 | 6/1981 | Kurtin | 179/1 J |

FOREIGN PATENT DOCUMENTS

| | | |
|---|---|---|
| 2737983 | 3/1978 | Fed. Rep. of Germany . |
| 2413009 | 7/1979 | France . |
| 1556500 | 11/1979 | United Kingdom . |

OTHER PUBLICATIONS

Radio Mentor Electronic, vol. 42, Jan. 1976, No. 1, Berlin, DE; K. O. Bader, B. A. Blesser; pp. 023-026, "Klangumformung . . . ".
Journal of the Audio Engineering Society, vol. 27, Oct. 1979, No. 10, New York, USA, G. W. McNally, pp. 793-803, "Microprocessor Mixing . . . ".
Funkschau, vol. 51, Nov. 1979, No. 24, Munich, DE; H. Pichler et al, pp. 1409-1410, "Prinzipien und Realisierung Formen . . . ".
Journal of the Audio Engineering Society, vol. 25, No. 12, Dec. '79, New York USA; W. C. Jung, pp. 1033-1038, "Application Considerations . . . ".

*Primary Examiner*—E. S. Matt Kemeny
*Attorney, Agent, or Firm*—John P. Snyder

[57] ABSTRACT

The present invention relates to a system for generating within a relatively small enclosed space a sound field corresponding to that in a relatively large enclosed space having specific acoustic characteristics, said system including an input unit adapted to receive at least one primary electric audio signal, the output of which is connected to the input of a signal processing unit having a number (N) of secondary channels, each provided with signal processing means with selectable delay time and selectable gain constant, the N outputs of said channels being intended to produce N secondary electric audio signals, each to be supplied to one of N secondary loudspeaker units placed in said relatively small enclosed space in preselected positions. The invention proposes a system of a kind as mentioned above and comprising a programmable memory for storing parameter groups representative of a number of various relatively large enclosed spaces, i.e. each comprising N delay times and N gain constants, and selecting means for selectively activating just that part of the memory, in which the parameter group representative of a desired enclosed space is stored.

4 Claims, 19 Drawing Figures

SOUND FIELD SIMULATION SYSTEM AND METHOD FOR CALIBRATING SAME

This application is a continuation of application Ser. No. 574,639, filed Jan. 30, 1984, which is a continuation of 305,198 filed Sept. 24, 1981 both now abandoned.

The present invention relates to a system for generating within a relatively small enclosed space a sound field corresponding to that in a relatively large enclosed space having specific acoustic characteristics, said system including an input unit adapted to receive at least one primary electric audio signal, the output of which is connected to the input of a signal processing unit having a number (N) of secondary channels, each provided with signal processing means with selectable delay time and selectable gain constant, the N outputs of said channels being intended to produce N secondary electric audio signals, each to be supplied to one of N secondary loudspeaker units placed in said relatively small enclosed space in preselected positions.

Further, the present invention relates to a method for calibrating said sound field simulation system.

In the following description, the term "parameter group" will be used to signify one specific combination of selected constants relating to all N secondary channels, i.e. N delay times, and N gain constants. Therefore, a parameter group contains the information that characterizes a relatively large enclosed space to be simulated by the present system.

A similar system has been disclosed in U.S. Pat. No. 4,105,864. This prior art system has the severe disadvantage that, once the user has adjusted through listening a parameter group corresponding to a particular desired enclosed space as well as he is capable of, it is very time consuming to subsequently make adjustments for a parameter group corresponding to another relatively large enclosed space. For purposes of the present illustration, let it be assumed that 10 secondary loudspeaker units can be used to synthesize the desired sound field with sufficient realism. It will be appreciated that by employing this number of secondary loudspeaker units, 20 independent adjustments have to be made, that is for each loudspeaker unit the time delay introduced in the associated secondary channel, and the adjustment of the gain constant in that channel. In said U.S. Patent it has been stressed that the subjectively perceived spaciousness most probably is critically dependent on the delay, the direction, and the relative intensity of the "early reflections". This concept is commonly used in the science of auditorium acoustics and therefore will not be discussed in detail here. It may suffice to say that it is these early reflections, that give the listener an impression of the dimensions of a room, or "spaciousness". These early reflections are simulated by signal processing means connected to secondary loudspeaker units. Even relatively small deviations in the desired delay times and/or gain constants can have highly detrimental effects on the subjective spatial impression. Certainly when the user desires to listen with different adjustments in succession, the accuracy a desired adjustment can be attained with, is therefore not fully guaranteed. This is a limitation of the prior art system.

It has been common practice so far to adjust a system of said prior art type through listening, employing a trial and error procedure. It will be appreciated that such an adjustment is highly dependent on the personal taste of the user involved, which cannot be expressed in numbers. Therefore it is a requirement of a sound field simulation system to have an objective calibration feature.

The object of the present invention is to provide a solution for said limitations of the state of the art.

To that end the invention proposes a system of a kind as mentioned in the first paragraph, characterized by a programmable memory for storing parameter groups representative of a number of various relatively large enclosed spaces, i.e. each comprising N delay times and N gain constants, and selecting means for selectively activating just that part of the memory, in which the parameter group representative of a desired enclosed space is stored.

It is a further object of the present invention to provide a method for calibrating a sound field simulation system. This method is characterized by the following steps:

(1) switching off the secondary loudspeaker units, and driving at least one sound source, eventually positioned in a place representative of the primary source(s), for the emission of a broad band, e.g. at least predominantly corresponding to pink noise, acoustic signal;

(2) measuring the sound pressure level thereby produced in the listening room, hereafter termed reference value;

(3) switching on the secondary loudspeakers and adjusting the signal levels to same in such manner that the sound pressure level produced by them is equal to the measured sound pressure level produced by the primary sources or deviates therefrom in a chosen amount.

In a further refinement of this principle, the level of the secondary loudspeakers, the "reflection level", is adjusted depending upon the kind of music. For instance, the reflection level for organ music can be 3 dB higher than the reference value, and for speech, the other extreme, 2 dB lower. It will be appreciated that these values can be stored in the programmable memory.

The invention will now be explained with reference to the drawings, wherein.

Note that some figures show circuits or units forming part of a system in accordance with the invention. Therefore, various parts will be found in more than one figure. However, they will generally be described only once.

Figure 1:
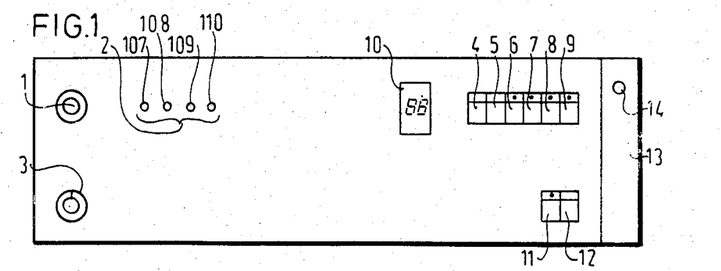
FIG. 1 shows a front view of a preferred embodiment of an electronic unit forming part of the system in accordance with the invention.

FIG. 1 shows a front view of a preferred embodiment of an electronic unit forming part of the system in accordance with the invention, housed in an enclosure. The front panel shown in FIG. 1 includes an input potentiometer 1 for adjusting the input level of the unit in such manner that the analog to digital converter (ADC), to be described later, never overloads. In this adjustment, the volume control of the amplifier being used is turned up as far as ever desired in practice, while playing back loud passages from a tape or record.

It should be observed that the system of the invention is not limited to the reproduction of music through a recording medium such as tape or phonograph record. E.g. a talker, a singer, or a music player can also supply his acoustical information to a microphone attached to the input of the system in accordance with the invention. Whereby the desired reflection pattern is immediately derived from the acoustic information emanating from the talker or performer. In this case one can therefore relinquish the use of one or more primary loudspeakers; the talker or performer himself acting as primary source.

The signal level, particularly as regards the maximum allowable level, is monitored by a headroom indicator 2, comprising four light emitting diodes, each corresponding to a certain signal level, said diodes being controlled by the ADC to be described later. It is made as a peak level indicator having a short attack time constant and a long decay time constant. The adjustment of the first control 1 is made only once with the aid of indicator 2.

The front panel further includes a second control 3. This control 3 is part of an adjustable low pass filter, through which an often desired attenuation of the higher frequencies can be selected.

Two push buttons 4, 5, connected to a master attenuator, serve to simultaneously control the level of all outputs in steps of 1 dB. Depressing key 4 causes a gradual increase in level, key 5 a decrease. The control range is 0 through 30 dB, and the selected value can be read on a display 10, which in this example of a preferred embodiment comprises two 7-segment numeric display units. Anticipating the detailed discussion of the units, to be given later, it is observed herewith that the power amplifiers are DC coupled. When one of the power amplifiers fails, causing a DC voltage to appear in its output, the display 10 will blink, and the power supply will be switched off.

There are four program keys 6, 7, 8, and 9, each including a light emitting diode. E.g. the first program key corresponds to an enclosure especially made for speech, key 7 corresponding to a room mainly suitable to opera or chamber music, the third one to a large concert hall for symphonic music performances, and the fourth key to a cathedral, particularly for the reproduction of organ music. When one of the keys 6 through 9 is depressed, its associated light emitting diode is lit. When the same key is depressed a second time, the entire electronic simulation unit is switched off, and its associated light emitting diode is extinguished. By depressing the key once more, the simulator is put to normal operation again. In this way it is simple to judge the effect produced by the auditorium acoustics simulator.

By depressing key 11, which includes a light emitting diode, the levels of the stereo amplifier and the simulator are attenuated 20 dB, and the associated light emitting diode starts blinking.

Key 12 serves to switch on the power supply. The power supply for the power amplifiers has a delayed turn-on.

At the right hand side of the front panel in this embodiment, is a remote control unit 13, embodied as a plug-in module, the receiving element of which comprises a light sensitive diode 14.

Figures 2, 3, 5:
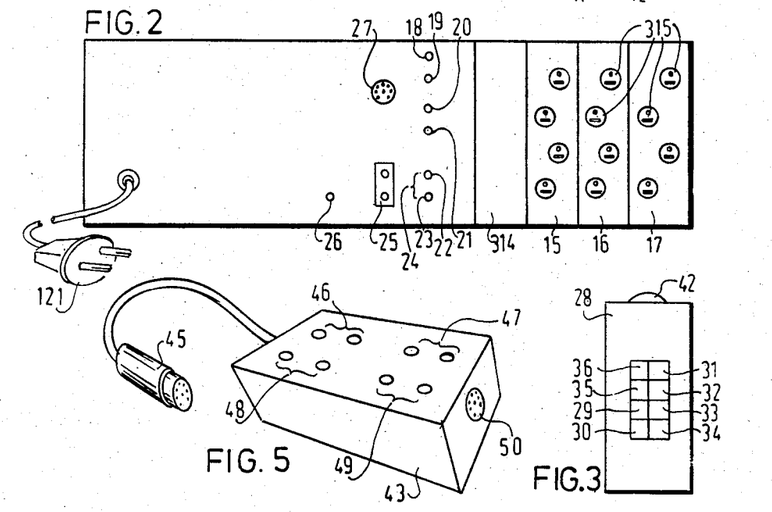
FIG. 2 is a rear view of same.
FIG. 3 is a top view of a remote control unit for the unit shown in FIG. 1 and 2.
FIG. 5 is a junction box for the system in accordance with the invention.

The rear panel of the electronic unit in accordance with the invention, shown in FIG. 2, includes a plug-in program module 314, and three output modules 15, 16, 17 comprising power amplifiers for a total number of 12 loudspeakers, and each including loudspeaker connecting means 315. These modules 15, 16, 17 are also embodied as plug-in units, so that if so desired, one can start with one module and four loudspeakers, and extend the system progressively.

Two input jacks 18, 19, corresponding to the right and left audio channel respectively, are to be connected to the outputs of the stereo pre-amplifier spa, and the corresponding output jacks 20, 21 to the inputs of a stereo power 37 for the primary stero loudspeaker units ps amplifier.

The present electronic unit offers the possibility of making optimum use of equalizers, by themselves well known, e.g. band pass filters of the octave or third octave type, such as often used to equalize or flatten the frequency response of a loudspeaker system in a certain listening environment. Until now such equalizers have always been made part of the signal chain of the primary loudspeakers. However, the subjective impressions of such systems, even when optimally adjusted, have as yet been very disappointing. This is caused by the fact that the aural impression, as experienced by a listener, particularly with respect to the timbre of the various instruments, is only partly formed on the basis of acoustical information arriving directly from the loudspeakers. When one listens in for example a concert hall, the direct part of the sound is responsible firstly, for the subjective evaluation of transients, as produced by some instruments, e.g. guitar, clavichord, percussion instruments, and secondly, for the ability to localize individual instruments. Therefore, the characteristics of the primary loudspeaker units, particularly the transient response, must not be tampered with. However, conventional equalizers are adjusted by using stationary acoustic test signals, wherein the total acoustic characteristics of the listening room are involved for a large part or even predominant in the test results. It will be appreciated that in this way a loudspeaker, having in anechoic conditions an optimally flat frequency response and therefore also a good transient response, is adjusted in a completely false manner to the fortuitous acoustic conditions in the room involved. It has been found that in a system in accordance with the invention, optimum use can be made of all fundamental advantages offered by equalizers. Referring to the aforementioned it will be appreciated that the information coming from the primary loudspeakers remains uncontaminated, provided that very high quality loudspeakers are employed and that the echo-information, mostly related to the characteristics of the listening room, are subjected to equalization. Extensive listening tests have revealed that the improvement attainable in this manner is very spectacular. The listener gets a very lifelike aural impression, that is with a high degree of perfection identical to the aural impression he would perceive in a concert hall chosen by himself. In view of the aforementioned, an output jack 22 is included in the rear panel shown in FIG. 2, to be connected to an equalizer of conventional type, while the output of the equalizer can be connected to input jack 23. These jacks 22, 23 are incorporated in the signal processing chain in such manner, that the equalized audio signal is exclusively supplied to the secondary loudspeakers. If so desired, the jacks 22, 23 can be connected to each other through an appropriate U-link 24.

The rear panel further includes an outlet 25, which is connected to the power line via the power switch controlled by key 12. This outlet 25 is to supply power to all other units of the installation. In this way, the whole installation can be switched on and off with key 12.

On the rear panel is also mounted a noise output jack 26, which is connected to supply an output signal corresponding to pink noise for the adjustment of the output level of the auditorium acoustics simulator. This is performed by connecting said output jack 26 to an input of the pre-amplifier. First one measures the sound pressure level of a primary source connected to it, for example the two primary stereo loudspeakers units ps, by using a sound pressure level meter plm, or lacking this, a microphone attached to for example a tape recorder with a level indicator. Subsequently, the primary loudspeakers ps are switched off, and the simulator is switched on. Now the sound pressure level is set to the same value by operating keys 4, 5. The set attenuation in dB is read on the display 10, and jotted down as reference value. It has been recognized in the literature on auditorium acoustics that the optimum reflection level is somewhat dependent on the kind of music. For organ music it can be 3 dB higher than said reference value, and for speech, the other extreme, 2 dB lower. These small, but not insignificant variations can best be taken into account via the program, that is, via the program module 314, so one does not have to readjust on each change of program. It should be pointed out that said values for respectively, speech and organ music are subjectively, on the average, the most preferred values in practice. The system in accordance with the invention is evidently suitable not only to adapting the reproduction to a subjectively optimum condition, but also and even particularly to simulating a sound field corresponding to an existing acoustic environment.

An 8-contact DIN receptacle 27 is intended for connection of units, to be described later with reference to FIG. 4 and 5.

FIG. 3 shows a wireless remote control unit 28 including 8 keys 29, 30, 31, 32, 33, 34, 35, and 36. Keys 29, 30 are configured to turn the volume control of the stereo amplifier 37 through a coupling element, e.g. a belt or chain 40. For the sake of clarity, we will briefly explain how keys 29 and 30 should be operated to adjust the volume control 41. For example, by depressing key 29, a signal is generated in the remote control unit 28, in a way to be described later. Said signal is applied to a transmitting device 42, e.g. a light emitting diode. The light sensitive diode 14 shown in FIG. 1 receives this signal, which is decoded, and subsequently supplied via the 8-contact DIN receptacle 27 to the remotely controlled adjustment unit 38, which then starts to function by appropriately setting the volume control 41 through rotation of the electric motor forming part thereof.

The junction box shown in FIG. 5 is especially designed for those cases, wherein the pre-amplifier cannot be disconnected from the power amplifier. In this case the junction box 43 is connected between the power amplifier and the loudspeaker; it also includes a level decrease switch not shown, the operation of which is basically similar to switch 11 shown in FIG. 1.

The keys 31, 32, 33, 34, 35, and 36 shown in FIG. 3 duplicate the function of keys 6, 7, 8, 9, 11, 12 mounted on the front panel.

Figure 4:
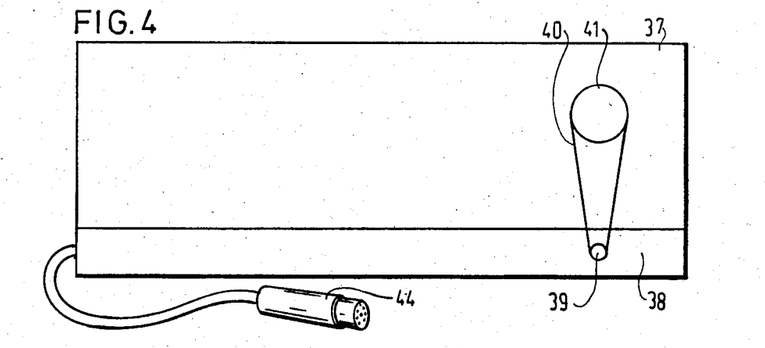
FIG. 4 is a schematic view of a commonly used stereo amplifier in conjunction with a unit in accordance with the invention, through which the amplifier can be adjusted by remote control.

The remotely controlled adjustment unit 38 shown in FIG. 4 is provided with a cable having an 8-contact DIN plug 44, which is to be mated to the DIN-receptacle 27 shown in FIG. 2.

The junction box 43 shown in FIG. 5 is also provided with a similar DIN plug 45. The unit 43 also includes a few pairs of jacks; the pair 46 is to be connected to the left output terminals of the power amplifier, the pair 47 to the right channel of the power amplifier, the pair 48 to the left primary loudspeaker, and the pair 49 to the right primary loudspeaker. The junction box 43 further includes an 8-contact DIN receptacle 50 for connection of the DIN plug 44 shown in FIG. 4.

With regard to the electronic unit in accordance with the invention, shown in FIG. 6, i.e. the auditorium acoustics simulator proper, the briefest description will now be given.

Output signals coming from a stereo pre-amplifier spa enter via the input jacks 18, 19. These are connected to two attenuator networks 51 and 52, respectively, which are switched in or out, depending on the state of two relay switches 53a, 53b, said state being dependent on current flowing through relay coil 53. Said current can be controlled by the user through operation of key 11 shown in FIG. 1, or key 35 shown in FIG. 3. The attenuator networks 51, 52 in this example of a preferred embodiment, are dimensioned in such manner that an attenuation of either 0 dB or 20 dB can be selected. The movable contacts of the switches 53a, 53b are respectively connected to the output jacks 20 and 21, which are intended for connection to the input of the power amplifier for the primary loudspeakers.

Said movable contacts are also connected to two resistors 54 and 55, respectively, both in conjunction with an operational amplifier 56, and a feedback resistor 57, configuring a summing circuit, the output of which is connected to the output jack 22 for connection to the input of an equalizer. In the configuration shown the output jack 22 is connected to the input jack 23 through a U-link 24, said input jack being connected via input potentiometer 1, the first control, to an input amplifier 58. At the output of this amplifier all spectral components above the Nyquist frequency are eliminated through an anti-aliasing filter 59. To achieve the best possible signal-to-noise ratio (it should be observed that in a digital signal processor of this kind quantization noise is generated) selectable pre-emphasis is employed. This pre-emphasis is introduced by a preemphasis unit 60. In conjunction with a de-emphasis unit 61 having a fixed de-emphasis time constant of 70 μs, which is to be described later, this configures the adjustable low pass filter, which is the second control 3 (see FIG. 1), that can be externally operated. It will be appreciated, that in view of the fixed de-emphasis time constant, an attenuation of the high frequencies can be achieved by decreasing the amount of pre-emphasis in the unit 60.

The output signal of the unit 60 is supplied to a sample and hold circuit 62, which is configured and connected to take a sample after each interval of 31.25 μs, the output signal of said unit 62 is supplied to an ADC 63. The digital data coming from said ADC are stored in a memory unit 64 consisting of RAM's (random access memory). There are one write cycle and twelve read cycles, viz. one read cycle for each of the twelve outputs. Therefore, one cycle lasts 31.25 divided by 13 =2.4 μs. The ADC operates with the same cycle time, thus 2.4 μs/bit; this is not strictly necessary, but very practical. A 10-bit code is used: SIGN, SCALE & 8-bit MAGNITUDE, achieving a 12-bit resolution. If the analog signal level exceeds some value, an 18 dB attenuator is switched in. Thus the ADC needs 24 μs for conversion, in which the sample and hold circuit 62 is in the hold state. The remaining time, viz. 31.25−24=7.2 μs, is used by the circuit 62 to take a new sample. A clock generator 65 is connected to various units to synchronize the operations, e.g. via clock line 177 to the ADC 63.

Figure 6:
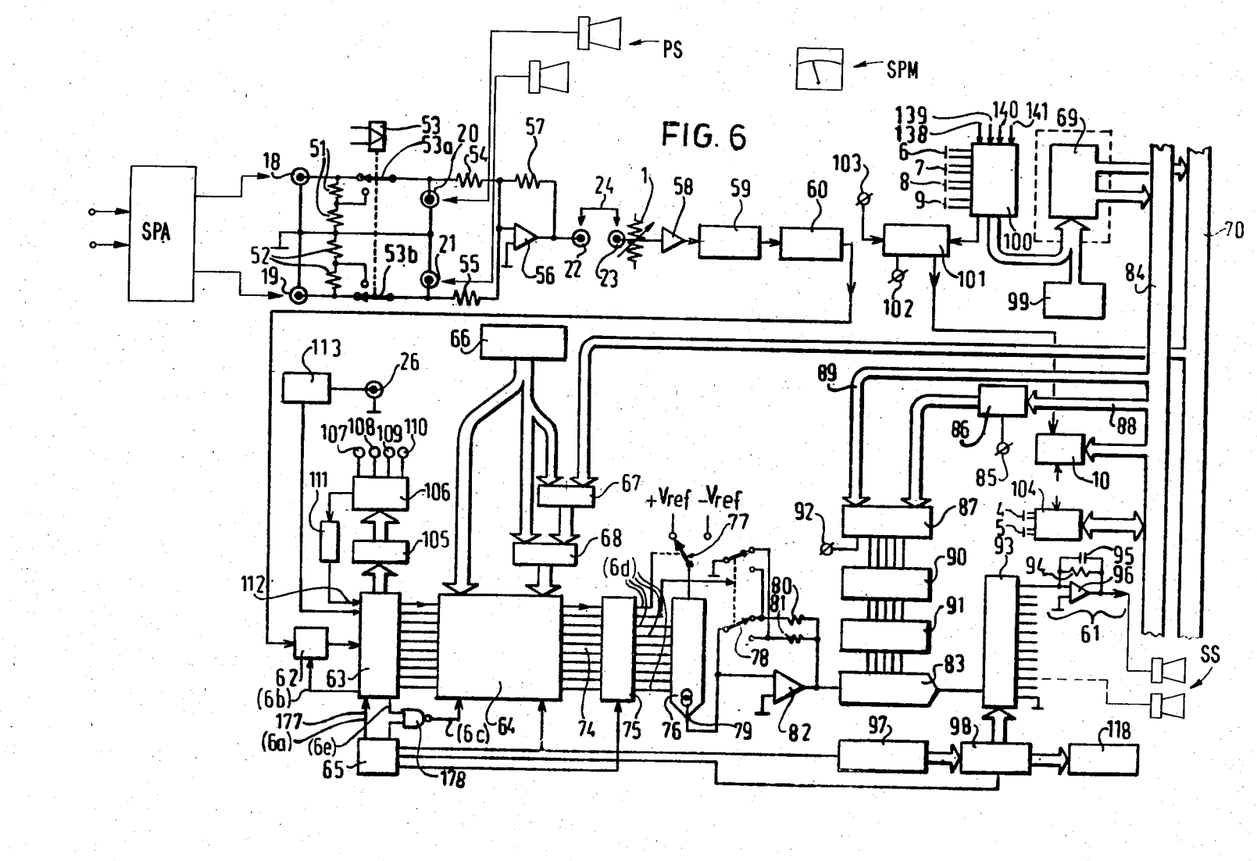
FIG. 6 shows schematically, mainly in the form of a block diagram, a preferred embodiment of the electronic unit forming part of the system in accordance with the invention.
Figures 6A, 6B, 6C, 6D, 6E:
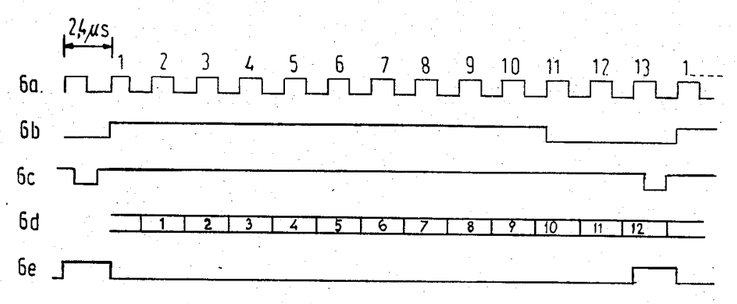
FIGS. 6a-6e show timing waveforms.

The FIGS. 6 a through e show some waveforms of signals, as they occur in the unit shown in FIG. 6. The signal shown in FIG. 6a occurs on the line 177 between the clock generator 65 and the ADC 63. The same signal, but shifted ¼ period, occurs on the line between the clock generator 65 and the NAND gate 378. The line from the ADC 63 to the sample and hold circuit 62 carries the signal shown in FIG. 6b and at the output of NAND gate 378 is the signal shown in FIG. 6c FIG. 6d shows in a time diagram the signals at the output of the memory unit 64. FIG. 6e shows the waveform of the signal on the line between the ADC 63 and the gate 378.

To obtain delays through a RAM, such as the memory unit 64, one has to create an offset between the write addresses and the read addresses. The write addresses are generated in decreasing order with a down-counter 66. By adding a fixed amount to it by means of an adder 67, one gets the read address. The write and read addresses have to be supplied at different times. To that end a multiplexing unit 68 is used. One can also start with an up-counter, but then one has to subtract addresses or work in 2's complements, which is more complicated. The offset that is supplied to the binary adder 67, is part of the program, stored in a program unit 69, comprising a programmable read only memory (PROM), and is dumped in delay bus 70. The delay bus 70 carries 7-bit data, as the delays have a range of 0–127 ms, selectable in 1 ms steps. The memory can be viewed as a delay line having taps at each interval of 31.25 μs (sample period). Only the taps at each interval of 1 ms are used. That is why the remaining address lines of the down-counter can be connected directly to the memory unit 64.

Figures 7, 7A:
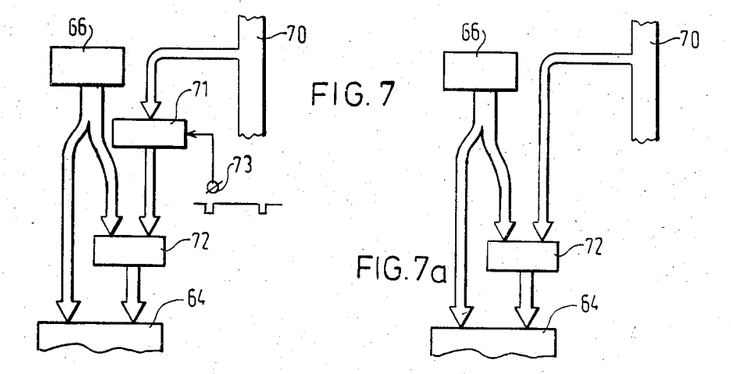
FIG. 7 is another embodiment of a detail of the unit shown in FIG. 6.
FIG. 7a is an alternative form of the circuit in FIG. 7.

Addressing can also be achieved through other methods. For instance, data from the delay, bus can be set to zero with AND gates, while an alternative way is the generation of zeros by the program in the programmable unit 69 during the write cycle, in which case the AND gates can be omitted. So FIG. 7 shows the above-mentioned modification, wherein the information from the delay bus 70 is fed to the block 71 comprising AND gates, the output signal of which is supplied to an adder 72, the other inputs of which are connected to the output of the down-counter 66. The AND gates 71 have also an input 73 for a clock signal with a waveform as shown schematically, the portions of it with relatively low level corresponding to "write", and those with relatively high level to "read". This clock signal is the signal shown in FIG. 6c.

FIG. 7a shows an alternative form of the circuit in FIG. 7. In this alternative form, the program unit is arranged and connected to generate logic zeros ("0") during the write cycle of the RAM 64.

The data outputs of the memory unit 64, which are time multiplexed, are supplied via a buffer register 75 to an 8-bit digital to analog converter or DAC 76 and two CMOS switches 77, 78 for the, SIGN bit and the SCALE bit, respectively. The SIGN bit selects the polarity of the reference voltage, designated $V_{ref}$ on the switch 77, and the SCALE bit controls the gain of the output amplifier of the DAC 76, said output amplifier being connected to a current output 79 of the DAC 76, and embodied as an operational amplifier 82 with feedback network comprising resistors 80, 81. It will be appreciated from the configuration shown that the switch 78 controlled by the SCALE bit determines the resistance of the feedback network, and consequently, the gain constant of the output amplifier, which serves as a current to voltage converter in this way. The double-pole SCALE bit switch 78 is a current switch, as all contacts are on ground potential, and therefore is very fast acting. At the operational amplifier's (82) output, the signal is in voltage form, and the switching speed at this point is dependent on the settling time of the amplifier. This has to be as short as possible. The output voltage of this amplifier 82 is the reference voltage for a multiplying DAC 83, which is controlled by the programmable unit 69 via an attenuation bus 84. This multiplying DAC controls the attenuation of the audio signals supplied to the 12 loudspeakers, depending on the output attenuation stored in the program in the unit 69, and the adjustment of the master attenuator, already described, which is controlled by operation of the keys 4, 5. The output attenuation is the individual attenuation for each loudspeaker (in this embodiment 0–19 dB, 20=off), the master attenuator for all loudspeakers simultaneously (0–30 dB). The amount of attenuation in dB is presented in digital form on the attenuation bus 84, be it time-multiplexed, e.g. 6 dB=00110. Data signals coming from said master attenuator are dumped into the bus during the write cycle of the memory 64. They are stored in a latch 86 having a clock input 85, and using binary adder 87, added to the data signals representing output attenuation, that appear during the read cycles. The data flows corresponding to the master attenuator and the output attenuator are designated 88 and 89, respectively. The adder 87 controls via a register 90 a read only memory (ROM) 91, that converts the logarithmic dB scale to a linear scale for driving said multiplying DAC 83. The output attenuator and the master attenuator together have a control range of 50 dB, which is too large for an 8-bit DAC. Therefore, each channel includes a 25 dB attenuator (in the output module to be described later), to be switched in or out at will by the range bit coming from the output 92 of the adder 87. In this way the MDAC 83 has to encompass a range of 25 dB only.

Figure 8:
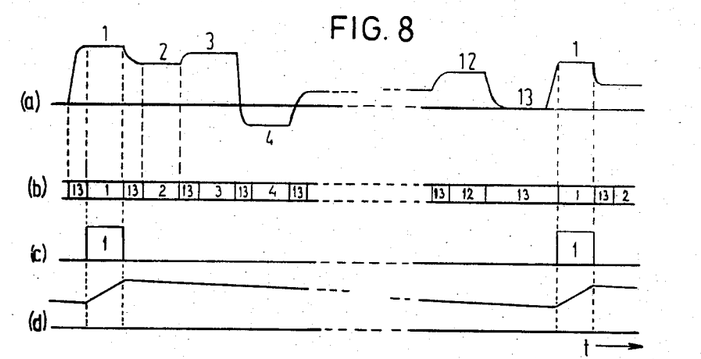
FIG. 8(a) thru (d) show some schematically drawn waveforms illustrating how the unit in FIG. 6 works.

The output of the MDAC 83 is connected via demultiplexer 93 to 12 current controlled operational amplifier 96, having a feedback network comprising a parallel circuit of a resistor 94 and a capacitor 95, in such manner that a low pass characteristic with a time constant of 70 μs is achieved, being the aforementioned de-emphasis. The limited working speed of amplifier 82 has to be taken into consideration, when demultiplexer 93 is switched. FIG. 8 shows an example of an output signal that may occur at the output of amplifier 82. The signal shown in FIG. 8a is the input signal to the MDAC 83, or the reference voltage. In the stationary parts of the waveform shown in FIG. 8a, the various channels are designated by their number, viz. 1, 2, 3, 4, . . . 12, 13. Note that the 13th channel is grounded.

FIG. 8b shows the various effective operation cycles of the demultiplexer unit 93, in which it is apparent that effective operation only starts a certain time delay after the leading edge of a step corresponding to some channel. This delay corresponds to the "13th channel".

FIG. 8c shows in conjunction with FIG. 8a and 8b for channel 1, which signal is supplied in this way to the de-emphasis amplifier 96 corresponding to channel 1. This signal is, as previously said, a current supplied from the demultiplexer 93; this input current signal is converted to the output voltage signal shown in FIG. 8d through the configuration 61 as shown, comprising operational amplifier 96, resistor 94 and capacitor 95.

During the signal transition, while the output voltage of amplifier 82 slews more or less gradually to its final value, the demultiplexer 93 is switched to its 13th output, which is grounded, as previously said. Once amplifier 82 is settled, that is, once its output signal has reached the proper value, the demultiplexer 93 is switched to one of the twelve signal outputs. By switching in this way, the occurrence of slewing distortion and interchannel crosstalk is prevented. Each of the output amplifiers, whereof only one (96) corresponding to channel 1 is shown, receives current pulses at its input, see FIG. 8c. The de-emphasis unit 61 operates more or less as a hold circuit, causing the signal to loose its pulselike characteristics.

The demultiplexer is addressed through a counter 97 and an address decoder 98.

Figure 9:
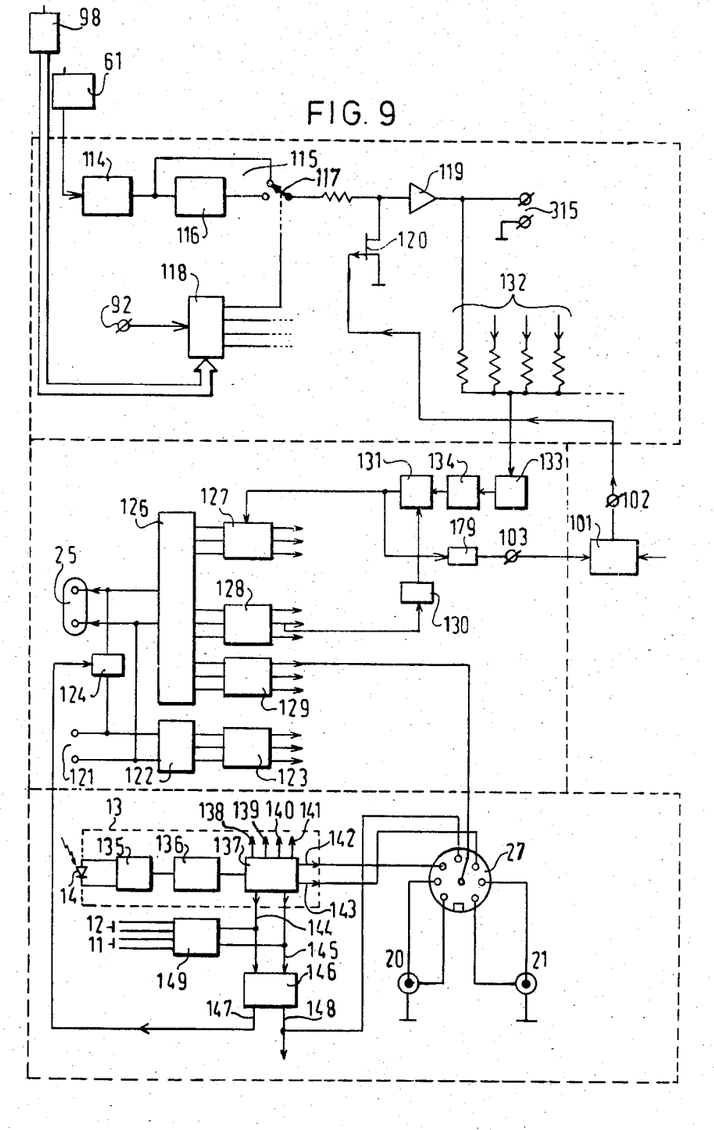
FIG. 9 shows schematically, mainly in block diagram, some modules to be used in conjunction with the electronic unit in FIG. 6.

The aforementioned programmable unit 69 is part of a plug-in program module 314, and includes four programs. Each program is a combination of 12 delay constants and 12 attenuation constants, respectively in 7-bit (0–127 ms), and 5-bit (0–20 dB) binary code. Unit 69 is addressed through a 4-bit counter 99, counting from 0 to 12, and a program control unit 100, to which keys 6, 7, 8, 9 shown in FIG. 1, and the four output lines 138, 139, 140, 141 of decoder 137 shown in FIG. 9 are connected. The program control unit 100 supplies an output signal to a signal muting circuit 101, that can suppress all signals of the simulator. This has been described with reference to FIG. 1, and is intended for judging the effect of the simulator. The suppression is done in conventional manner by switching on a field effect transistor (FET) in the output module via terminal 102. Said circuit 101 further includes a terminal 103 to connect the circuit 101 to an on/off control unit, to be described later, which is part of the power supply unit.

Using counter 104, to which previously said two keys 4, 5 (see FIG. 1) are attached, and the numeric display 10, both connected to the attenuation bus 84, the master attenuation (88) can be adjusted. The control range is 0–30 dB, and the counter 104 is made to count up to 30 only.

The headroom indicator 2 comprises a register 105, controlled by the ADC 63 and a decoder/driver 106 with time constants, connected to four light emitting diodes 107, 108, 109, and 110. The time constant is small for increasing signals and large for decreasing signals, thus achieving a clear indication of peaks.

There is also a line running from decoder 106 via a time constant unit 111 to an input 112 of the ADC 63, that corresponds to a noise gate. When the signal drops below a preselected low threshold, the three least significant bits (LSB) of the ADC are set to zero. In this way disturbing low frequency sounds, already below hearing threshold, are prevented from causing quantization noise.

The calibration procedure requires that the secondary loudspeakers SS be switched off so that no sound can emanate therefrom. Then, the calibrating sound is generated either by utilizing the primary speakers PS or another suitable sound source which is located at the region of the primary speakers. Regardless of the origin of the calibrating sound source, the sound generated corresponds generally to pink noise and the sound pressure level thus generated is measured. Any suitable sound source and any conventional measuring means may be used. For example, the pink noise generator 113 may be connected through its outlet jack 26 (see FIG. 1) and the stereo preamplifier SPA to the sound source (e.g., the primary speakers PS) for calibration purposes and the sound pressure level thus generated may be measured by any conventional meter SPM for so doing; or a microphone attached to a tape recorder having a signal level indicator associated with it may be used to drive the primary speakers PS through the stereo preamplifier SPA and the level indicated at the tape recorder used as the reference value. In any case, the reference value of the sound pressure level value is determined. Then, the primary speakers PS are switched off so that no sound may emanate therefrom and the secondary speakers SS are switched on so that the pink noise input from the generator 113 is the sole source of sound output from the secondary speakers SS. Then, the master attenuation is adjusted by manipulation of the push buttons 4 and/or 5 controlling the master attenuator 104 (display at 10) until the sound pressure level from the secondary speakers SS is adjusted as desired. The adjustment may be to match the pink sound pressure level emanating from the secondary speakers SS to the aforesaid reference value or the adjustment may be made to differ therefrom by a desired amount. In regard to this latter, when the system is to be fed with a program source which is speech, the calibration should be effected such that the pink noise sound pressure level from the secondary speakers should be adjusted to a value which is 2 dB lower than the aforesaid reference value, or, when the program source is to be organ music, the sound pressure level from the secondary speakers should be adjusted to a value which is 3 dB higher than the reference level.

Noise generator 113 is intended for the previously described calibration procedure, and supplies a dither signal, having a peak amplitude approximately amounting to one half LSB, to the ADC 63. Without this dither signal the quantization noise is correlated to the input signal. On a sine wave signal with a small amplitude (coarse quantization) there is clearly audible distortion in this case. When a small amount of noise is added in the form of said dither signal, then the correlation between the sine wave signal and the attendant quantization products is annulled, in other words the quantization distortion is converted into noise. Then a pure sine wave plus a little noise is perceived, which is subjectively less annoying than a sine wave signal with distortion. When one listens to music, quantization distortion is perceived as "granulation" of the reproduced signal.

Now a brief description follows of the circuit shown in FIG. 9.

There are three output modules, each having four channels. The output signal of the de-emphasis unit 61 shown in FIG. 6 is applied to the low pass filter 114 in FIG. 9. High frequency components of said current pulses are completely removed from the signal by the filter. The output signal of the low pass filter is supplied to a range attenuator 115, comprising a 25 dB attenuator 116 and a switch II7 controlled by said range bit via an addressable register 118. The audio signal is applied to a power amplifier 119, of which there are four in one module. The input of said power amplifier 119 can be shortcircuited through a junction-FET 120 under control of above-mentioned muting circuit 101.

One part of the power supply unit of the simulator, shown in the center of FIG. 9, can be switched on or off through the power switch 12 on the front panel or the switch 36 on the remote control unit 28, while another part remains in operation continously. The latter part supplies power to the remote control module 13 and various CMOS circuits storing the attenuation constant of the master attenuator and the program number.

The power supply unit includes a power input connector 121, having direct and continous connection to a transformer 122, the various secondary taps of which are connected to a rectifier/regulator unit 123. The units 122 and 123 configure part of the supply that is switched on continously.

The power input 121 is connected via TRIAC 124 to the switched power outlet 25 and a second transformer 126, the various secondary taps of which are connected to three rectifier/regulator units 127, 128, 129. Unit 127 serves to supply power to the power amplifiers in the output modules; unit 128 to power various digital units; unit 129 to power various analog units.

The power supply for the power amplifiers, of which only one (119) is shown in this figure, has a delayed switch-on feature. This is achieved by delaying one of the outputs of the unit 128 through an RC network 130 and supplying it to an on/off control unit 131. A few seconds after switching on the unit 127, the muting circuit 101 sets the junction-FET 120 in off condition, and the audio signal is let through. A JFET is chosen, as it is in on condition with the power supply switched off (that is, gate voltage =0), and therefore shorts the input of amplifier 119.

If one of the power amplifiers (1l9) malfunctions, it could supply a considerable DC voltage to the associated loudspeaker. Therefore, a protector is built in, comprising a summing network 132, an integrator or low pass filter 133 having a crossover frequency of approximately 1 Hz, and a level detector 134 controlling the on/off control unit 131. The effect of various delays is such that the rectifier/ regulator unit 127, controlled by the unit 131, is switched on and off periodically, and that the display 10, which receives a signal via delay unit 179 from the signal muting unit 101, blinks.

The lower part of the circuit shown in FIG. 9 is the remote control module 13. It comprises an infra red light sensitive diode 14, a pre-amplifier 135, and LSI chip 136, and a decoder 137 having 8 outputs: four output lines 138, 139, 140, 141 connected to the program control unit 100, two lines 142, 143 for outputting signals corresponding respectively to increasing and lowering the volume (=sound intensity), a power switch line 144, and a level decrease line 145. As long as a key of the remote control unit 28 is depressed, the corresponding line becomes and remains positive. The signals for the power switch 36 and the level decrease switch 35 are stored in a toggle flip-flop 146. A power switching output 147 of this is connected to the TRIAC 124 to control it, and a level decrease output 148 is connected to the relay coil 53 (see FIG. 6) controlling the switches 53a and 53b at the input of the simulator. The flip-flop 146 can also be operated via the front panel through key 12 and key 11, each connected to the respective input of the flip-flop 146 via a debouncer 149.

The lines 142, 143, 148 are also connected to the output jack 27.

Figure 10:
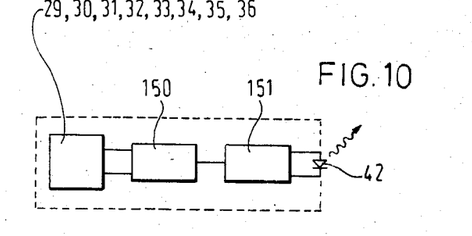
FIG. 10 is a block diagram of the remote control unit shown in FIG. 3.

FIG. 10 shows in block diagram the remote control unit 28, comprising keyboard 36, 35, 29, 30, 31, 32, 33, 34, an LSI chip 150, and a driver 151 for the transmitting device 42, which is a light emitting diode.

Figure 11:
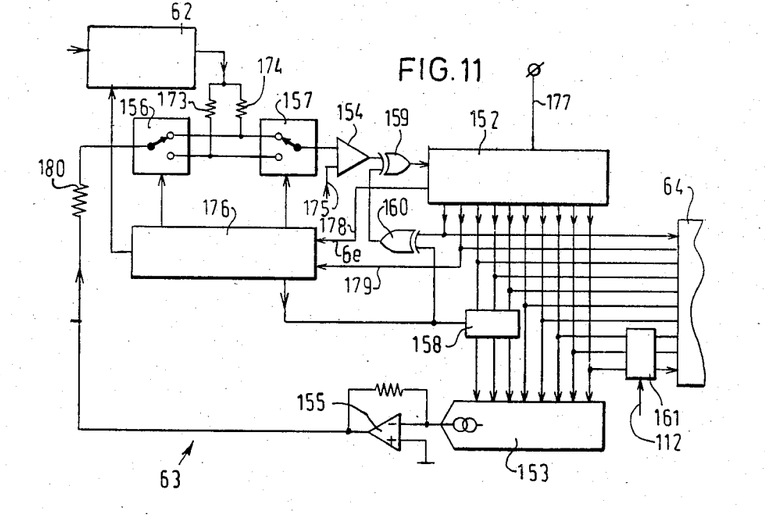
FIG. 11 is a more detailed schematic diagram of the analog to digital converter, forming part of the unit in FIG. 6.

ADC 63 shown in FIG. 11 is based on the well known principle of successive approximation (SA), but deviates in some details from the conventional type. An SA ADC generates step by step the digital code corresponding to a given analog value. An SAR (successive approximation register) 152, i.e. a register to perform the successive approximations, generates a binary number, that represents half full scale ($\frac{1}{2}$FS). A DAC 153 converts this number in an analog level, which is compared with the input signal. A comparator compares the level of the input voltage with the reference level and passes the result on to the SAR 152. The latter generates via DAC 153 a new reference level, that amounts to $\frac{1}{2}$FS $\pm\frac{1}{4}$FS, depending on the result of the previous approximation. If the input voltage had a higher level, the new reference becomes $\frac{1}{2}$FS $+\frac{1}{4}$FS. Now the comparator finds for instance that the input voltage has a lower level than the reference level; in that case $(\frac{1}{2}+\frac{1}{4}-\frac{1}{8})$ FS is tried as the next step, etc. In this way the analog value is approximated in progressively finer steps.

Now a more detailed description will be given of the ADC 63 shown in FIG. 11, which is employed in the simulator in accordance with the invention. The comparator 154, the SAR 152, the DAC 153 with its associated current controlled amplifier 155 are easy to recognize. CMOS switches 156 and 157 and AND gates, that together are designated with reference number 158, and two resistors 173 and 174 are needed because of the unconventional digital code. The control signals to the switches 156, 157 are supplied from the control unit 176, which also supplies control signals to the circuit 62 and the AND gates 158. These output control signals are derived from firstly a marker (see FIG. 6e) from the SAR 152 that signals the end of the conversion cycle, and secondly the SCALE bit signal. These signals are carried by lines 178 and 179, respectively. During the conversion of the SIGN bit, the DAC 153 is disconnected by setting switch 156 in the position shown, and switch 157 in the position not shown. The comparator 154 compares the input voltage with the voltage present at the comparator's other input 175, which is assumed zero for the moment. In the final embodiment the aforementioned random dither signal is applied to input 175. Half adders 159, 160 serve the purpose of applying the output signal of comparator 154 to the SAR 152 with the correct polarity; viz. by inverting or not.

Subsequently, the SCALE bit is determined. The three most significant bits of ADC 153 are set to zero through the AND gates 158, the other bits are set to a logic "1" by the SAR 152. The analog voltage corresponding herewith is approx. ⅛ FS. The input voltage is compared with this reference via the switches 156, 157, both set in the position shown. If the input signal has a higher value, both switches remain in the position shown during the next conversion of the MAGNITUDE bits. If not, they are set in the position not shown in the drawing. In the first case the resistor 174 is in the circuit, its resistance value being 8 times as high as that of resistor 173, which is in the circuit in the latter case. The resistor 180 connected between amplifier 155 and switch 156 has a value in the same order as the resistor 174. During the conversion of the most significant bit (MSB) and lower bits, the AND gates 158 are enabled, allowing the process to continue in regular fashion.

In view of the previous paragraph, it will be appreciated that the values of the resistors 80, 81 (FIG. 6) should be such, that the gain of the circuit, 78, 80, 81, 82 always compensates the attenuation by the resistors 173, 174. Therefore, the resistance ratio of the resistors 80 and 81 is chosen to be 8:1.

AND gates 161 set the three least significant bits (LSB) to zero, when the signal level drops below a certain threshold value. This is the noise gate, which has already been discussed and forms part of the ADC 63 shown in FIG. 6.

Figures 12, 13:
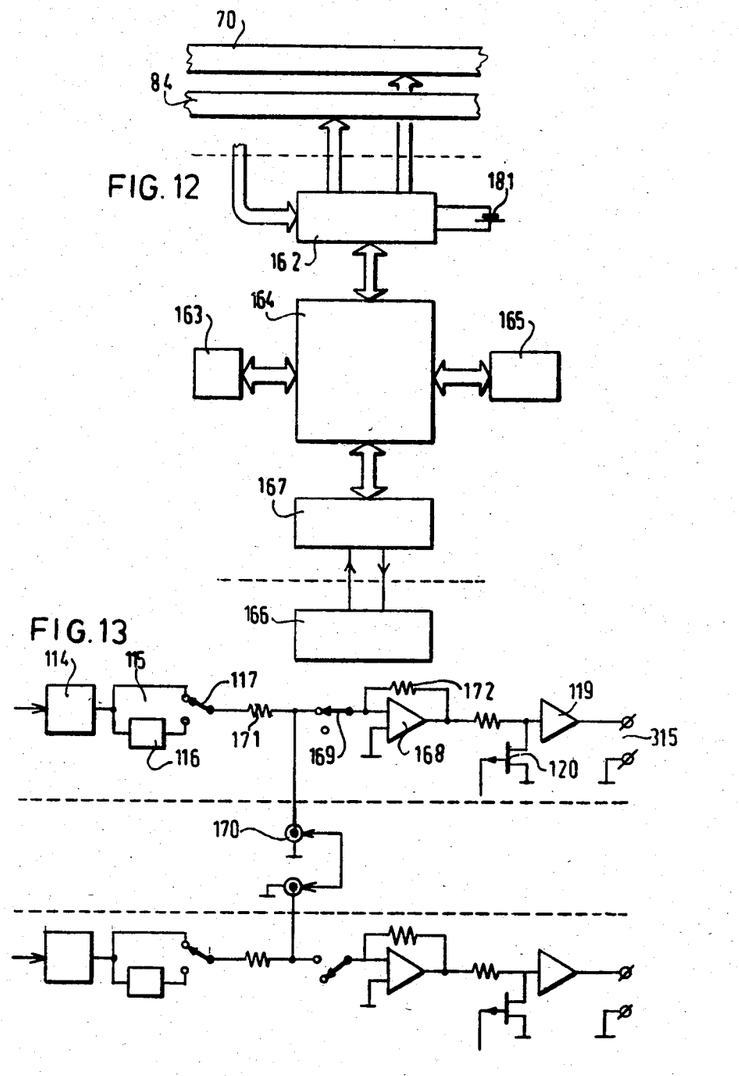
FIG. 12 is an alternative form of the program unit shown in FIG. 6, wherein a CMOS RAM and a microprocessor are employed.
FIG. 13 is a mixer for application in the system in accordance with the invention.

FIG. 12 shows an alternative form of the program unit 69 shown in FIG. 6. In this alternative version, intended to enable rapid changes of the various programs, instead of the unit 69 a CMOS RAM 162 is used, the content of which can be changed by operation of a keyboard 163 controlling a microprocessor 164. A numeric display 165 gives a visual indication of the channel number in conjunction with the corresponding delay and output attenuation. In order to safeguard against erasure of the memory 162 when the power supply is switched off, a battery 181 is provided. Alternatively, a nonvolatile memory can be used.

Data signals from an externally connected cassette recorder 166 can be read via an interface 167.

Such a feature will certainly be required for research in the field of acoustics, in addition to the capability of mixing multiple reflections and reverberation.

The latter is simply realized using the circuit shown in FIG. 13. This comprises an inverting amplifier 168 in the output module. The inverting input is connected to an in/out jack 170 via a switch 169. In order to mix multiple reflections, two or more output modules can be tied together as shown in FIG. 13. Optionally, two or more simulators in accordance with the invention can be used. To add reverberation the audio signal (the input signal for the simulator) is first supplied to a reverberation unit and then to a second simulator, thus generating 12 reverberation signals, each having a specific delay and attenuation. Subsequently, mixing can take place as indicated above. The most convenient way to switch programs when using multiple simulators is via remote control.

Note with reference to FIG. 13 that the elements corresponding to similar elements in FIG. 9 have been indicated by the same reference symbols as in the latter figure; in distinction to the circuit shown in the upper part of FIG. 9, the circuit in FIG. 13 has an extension comprising resistor 171, switch 169, inverting amplifier 168 with feedback resistor 172, and in/out jack 170. The lower part of the circuit in FIG. 13 is identical to the upper part. Both circuits configure an output module or are part of it; in the latter case they can be part of two independent simulators. The functional separation of both circuit parts is indicated by dashed lines. The in/out jack 170 is externally accessible. The lower circuit is not given reference numbers; the embodiment is, as said, fully identical to the circuit shown in the upper part.

I claim:

1. In the method of calibrating a sound field simulation system which comprises the steps of:
    (a) switching off secondary loudspeaker units of the simulation system;
    (b) generating a first sound source sound at least predominantly corresponding to pink noise;
    (c) measuring the sound pressure level of the first sound source sound generated in step (b);
    (d) switching on the secondary loudspeaker units;
    (e) producing a second sound source sound from said secondary loudspeaker units corresponding to said pink noise of step (b);
    (f) measuring the sound pressure level of said second sound source sound; and
    (g) adjusting the level of said second sound source sound as measured in step (f) to the level measured in step (c) or differing therefrom by a chosen amount.

2. In the method as defined in claim 1 wherein the level adjusted to in step (g) is the level measured in step (c).

3. In the method as defined in claim 1 wherein the level adjusted to in step (g) is 2 dB lower than the level measured in step (c).

4. In the method as defined in claim 1 wherein the level adjusted to in step (g) is 3 dB higher than the level measured in step (c).

* * * * *